(12) United States Patent
Liu et al.

(10) Patent No.: US 10,998,304 B2
(45) Date of Patent: May 4, 2021

(54) CONDUCTIVE LINE PATTERNING

(71) Applicant: Taiwan Semiconductor Manufacturing Company, Ltd., Hsinchu (TW)

(72) Inventors: Ru-Gun Liu, Zhubei (TW); Tung-Heng Hsieh, Zhudong Town (TW); Tsung-Chieh Tsai, Chu-Bei (TW); Juing-Yi Wu, Hsinchu (TW); Liang-Yao Lee, Taoyuan (TW); Jyh-Kang Ting, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/390,598

(22) Filed: Apr. 22, 2019

(65) Prior Publication Data
US 2019/0244950 A1 Aug. 8, 2019

Related U.S. Application Data

(60) Continuation of application No. 15/282,600, filed on Sep. 30, 2016, now Pat. No. 10,269,785, which is a
(Continued)

(51) Int. Cl.
*H01L 27/02* (2006.01)
*H01L 21/768* (2006.01)
(Continued)

(52) U.S. Cl.
CPC ........ *H01L 27/0207* (2013.01); *G06F 30/394* (2020.01); *H01L 21/76816* (2013.01); *H01L 21/76877* (2013.01); *H01L 21/76892* (2013.01); *H01L 23/528* (2013.01); *H01L 23/5226* (2013.01); *H01L 23/53209* (2013.01); *H01L 23/53271* (2013.01); *H01L 21/32139* (2013.01); *H01L 23/522* (2013.01); *H01L 2027/11875* (2013.01); *H01L 2924/0002* (2013.01)

(58) Field of Classification Search
USPC .......................................... 257/774; 438/637
See application file for complete search history.

(56) References Cited

U.S. PATENT DOCUMENTS 3,468,018 A 9/1969 Lutz
4,319,118 A 3/1982 Chason
(Continued)

FOREIGN PATENT DOCUMENTS

| CN | 1881223 A | 12/2006 |
|---|---|---|
| JP | 2006196878 A | 7/2006 |
| KR | 20120024805 A | 3/2012 |

*Primary Examiner* — Sheng-Bai Zhu
(74) *Attorney, Agent, or Firm* — Slater Matsil, LLP

(57) ABSTRACT

A conductive line structure includes two conductive lines in a layout. The two cut lines are over at least a part of the two conductive lines in the layout. The cut lines designate cut sections of the two conductive lines and the cut lines are spaced from each other within a fabrication process limit. The two cut lines are connected in the layout. The two conductive lines are patterned over a substrate in a physical integrated circuit using the two connected parallel cut lines. The two conductive lines are electrically conductive.

20 Claims, 2 Drawing Sheets

Related U.S. Application Data continuation of application No. 14/811,562, filed on Jul. 28, 2015, now Pat. No. 9,472,501, which is a division of application No. 13/930,859, filed on Jun. 28, 2013, now Pat. No. 9,136,168.

(51) Int. Cl.
*H01L 23/528* (2006.01)
*H01L 23/522* (2006.01)
*H01L 23/532* (2006.01)
*G06F 30/394* (2020.01)
*H01L 21/3213* (2006.01)
*H01L 27/118* (2006.01)

(56) References Cited

U.S. PATENT DOCUMENTS

| | | |
|---|---|---|
| 5,247,197 A | 9/1993 | Ema |
| 5,667,940 A | 9/1997 | Hsue et al. |
| 6,242,346 B1 | 6/2001 | Sun |
| 6,399,286 B1 * | 6/2002 | Liu ............... H01L 21/32139 216/66 |
| 6,492,073 B1 * | 12/2002 | Lin ....................... G03F 1/36 430/22 |
| 6,611,059 B1 | 8/2003 | Manning |
| 7,313,775 B2 | 12/2007 | Casey et al. |
| 7,343,570 B2 | 3/2008 | Bowers et al. |
| 7,691,549 B1 | 4/2010 | Glasser |
| 8,043,964 B2 | 10/2011 | Sandhu et al. |
| 8,309,462 B1 | 11/2012 | Yoshida et al. |
| 2005/0006671 A1 | 1/2005 | Heath et al. |
| 2005/0079721 A1 | 4/2005 | Buerger, Jr. et al. |
| 2006/0131064 A1 | 6/2006 | Hagiwara |
| 2007/0285983 A1 | 12/2007 | Ishii et al. |
| 2008/0080249 A1 | 4/2008 | Chen et al. |
| 2009/0114903 A1 | 5/2009 | Kalburge |
| 2009/0127723 A1 | 5/2009 | Zhang et al. |
| 2009/0224396 A1 | 9/2009 | Becker |
| 2010/0159685 A1 | 6/2010 | Chuang et al. |
| 2011/0037175 A1 * | 2/2011 | Bangsaruntip .... H01L 21/31144 257/773 |
| 2011/0042750 A1 | 2/2011 | Chuang et al. |
| 2011/0256308 A1 | 10/2011 | Buerger, Jr. |
| 2012/0045901 A1 * | 2/2012 | Kim .................. H01L 21/0337 438/703 |
| 2013/0049171 A1 | 2/2013 | Popp et al. |
| 2013/0062771 A1 * | 3/2013 | Kodama ............ H01L 21/0338 257/773 |
| 2013/0087527 A1 | 4/2013 | Pain et al. |
| 2013/0217233 A1 | 8/2013 | Chang et al. |
| 2013/0237050 A1 | 9/2013 | Kikutani |
| 2014/0024219 A1 | 1/2014 | Jung et al. |
| 2014/0078804 A1 * | 3/2014 | Hsieh ..................... G11C 5/063 365/63 |
| 2015/0363024 A1 | 12/2015 | Hayashi et al. |

* cited by examiner

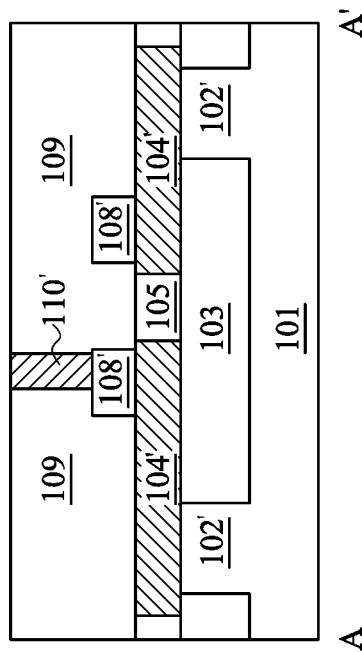
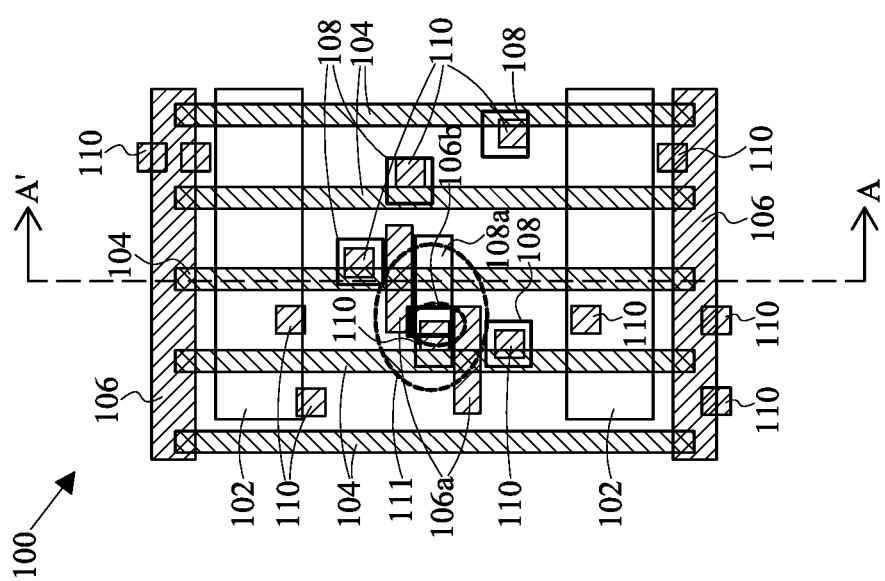
Fig. 1B
Fig. 1A ns shown for electrical connection to the conductive line 108'
CONDUCTIVE LINE PATTERNING

PRIORITY CLAIM AND CROSS-REFERENCE

This application is a continuation of U.S. patent application Ser. No. 15/282,600, filed Sep. 30, 2016 and entitled "Conductive Line Patterning," now U.S. Pat. No. 10,269,785, issued on Apr. 23, 2019, which application is a continuation of U.S. patent application Ser. No. 14/811,562, filed Jul. 28, 2015 and entitled "Conductive Line Patterning," now U.S. Pat. No. 9,472,501 issued on Oct. 18, 2016, which is a divisional of U.S. patent application Ser. No. 13/930,859 filed on Jun. 28, 2013, now U.S. Pat. No. 9,136,168 issued on Sep. 15, 2015, and entitled "Conductive Line Patterning," which applications are hereby incorporated herein by reference.

TECHNICAL FIELD

The present disclosure relates generally to an integrated circuit and more particularly to conductive line patterning.

BACKGROUND

For integrated circuit layouts, there are size limitations such as minimum pitch or spacing. In some layouts, a conductive line such as a polysilicon line is cut with a cut poly (CPO) pattern, but some layout methods have a photolithography process limit as the integrated circuit size shrinks. Methods to overcome the shortcomings in the state of the art are desirable.

BRIEF DESCRIPTION OF THE DRAWINGS

Reference is now made to the following descriptions taken in conjunction with the accompanying drawings, in which:

FIG. 1A is a schematic diagram of an exemplary integrated circuit layout of a conductive line structure according to some embodiments;

FIG. 1B is a cross section view of an exemplary physical integrated circuit that is fabricated according to the exemplary integrated circuit layout of the conductive line structure in FIG. 1A according to some embodiments.

DETAILED DESCRIPTION

Figure 2A:
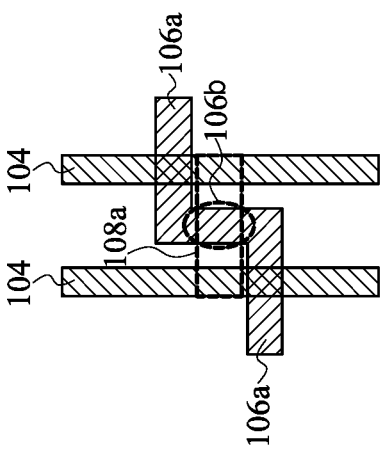
FIGS. 2A-2D are intermediate steps of generating the exemplary integrated circuit layout in FIG. 1A and fabricating the exemplary integrated circuit in FIG. 1B.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic diagram of an exemplary integrated circuit layout 100 of a conductive line structure according to some embodiments. The integrated circuit layout 100 includes active areas 102 where devices such as transistors are formed, modeled conductive lines 104 such as polysilicon, cut lines 106 such as cut polysilicon (CPO) pattern, other conductive line 108 in another layer such as a metal layer pattern, and vias 110. The integrated circuit layout 100 can be generated by a computer based system and stored in a computer readable medium.

The modeled conductive lines 104 in the layout 100 represent electrically conductive lines to be formed in a physical integrated circuit over a substrate. The modeled conductive lines 104 can comprise polysilicon or other electrically conductive material such as metal in a metal layer. The cut lines 106 represent cut sections or patterning area where the modeled conductive lines 104 are removed for electrical connections/disconnections according to the integrated circuit design.

In an exemplary layout area 111, there are two modeled conductive lines 104 and two cut lines 106a that cover a portion of the two modeled conductive lines 104. The two cut lines 106a are within a fabrication process limit from each other. For example, the minimum pitch for cut lines 106a in the layout 100 is 0.08 μm and there is a lithography process limit of 0.13 μm for cut lines 106a in some embodiments. The two cut lines 106a are spaced from each other within the process limit of 0.13 μm.

To help with the fabrication process, the two cut lines 106a are connected by a connecting cut line 106b in the layout 100. The connected cut lines 106a and 106b are etched out together in the fabrication process as described below with respect to FIGS. 2C-2D.

FIG. 1B is a cross section view of an exemplary physical integrated circuit that is fabricated according to the exemplary integrated circuit layout 100 of the conductive line structure in FIG. 1A according to some embodiments. The cross section view is along the cut line A-A'.

The substrate 101 includes the active area 102' and comprises silicon or any other suitable material. A shallow trench isolation (STI) area 103 is located between the active areas 102' for electrical isolation and comprises silicon dioxide or any other suitable material. The physical conductive lines 104' are shown with a cut section 105 filled with dielectric material. The cut section 105 is fabricated from the cut line 106a shown in the layout 100 that indicates that the modeled conductive line 104 in FIG. 1A is to be removed in the cut line 106a area during the fabrication process. The physical conductive lines 104' can be polysilicon lines in some embodiments. In other embodiments, the physical conductive lines 104' can be in a metal layer.

Another conductive line 108a in a different layer such as a metal layer is shown. The connecting conductive line 108a in the metal layer can electrically connect the two physical conductive lines 104' in the polysilicon layer. The via 110' is shown for electrical connection to the conductive line 108' (e.g., metal layer). In some embodiments, there is at least one via 110' disposed over the connecting conductive line 108', wherein the at least one via 110' electrically is connected to the connecting conductive line 108'. The dielectric layer 109 is used for insulation and comprises silicon dioxide, silicon nitride, or any other suitable material.

FIGS. 2A-2D are intermediate steps of generating the exemplary integrated circuit layout 100 in FIG. 1A and fabricating the exemplary integrated circuit in FIG. 1B. In FIG. 2A, two modeled conductive lines 104 and two cut lines 106a are shown in an integrated circuit layout similar to the layout 100 in FIG. 1A.

In some embodiments, the two modeled conductive lines 104 are parallel with each other, the two cut lines 106a are parallel with each other, and the two modeled conductive lines 104 and two cut lines 106a intersect at right angles. The modeled conductive lines 104 can be polysilicon lines or metal lines, for example.

The cut lines 106a are spaced from each other within the fabrication process limit. For example, a lithography process limit for cut lines 106a in some embodiments is 0.13 µm, and the minimum pitch for cut lines 106a in the layout is 0.08 µm. The two cut lines 106a are spaced from each other within the process limit of 0.13 µm.

Figure 2B:
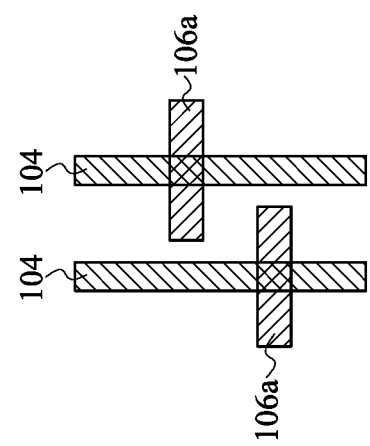

In FIG. 2B, the two cut lines 106a are connected by a connecting cut line 106b in the layout to help the fabrication process. In some embodiments, a connecting conductive line is placed between the two conductive lines 104 in the layout at a location between the two cut lines 106a in a different layer (such as another metal layer) from the two modeled conductive lines 104.

Figure 2C:
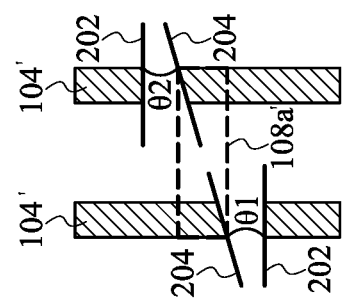

In FIG. 2C, the merged cut section 201 is based on the cut lines 106a and 106b in the integrated circuit fabrication. The merged cut section 201 is etched out together from the physical conductive lines 104' using a photolithography process. Note that the actual cut out section is not shaped with straight lines and right angles, as is the layout pattern. This, as is known in the art, is due to imprecision introduced by the manufacturing process, such as the lithography and etching processes.

Figure 2D:
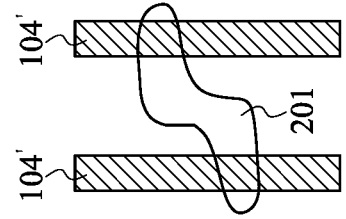

In FIG. 2D, the two physical conductive lines 104' are shown with cut angle lines 202 and 204 after the etching process in FIG. 2C. The cut angle line 202 is flat at a right angle with respect to the conductive line 104' in some embodiments. In this case, the cut angle of the cut angle line 202 is 0 degree. In comparison, the cut angle θ1 and θ2 of the cut angle line 204 is at different angles from the cut angle line 202. The cut angle θ1 and θ2 are in the range from 10 degree to 45 degree in some embodiments.

The two physical conductive lines 104' can be electrically connected using a connecting conductive line 108a' fabricated in a different layer in subsequent processes in some embodiments.

The technique in FIGS. 2A-2D can be applied, for example, to gate patterning for high density devices with a restricted layout rule. The physical conductive lines 104' can be polysilicon gate lines and the connecting conductive line 108' can be a metal line in a metal layer. In other embodiments, the physical conductive lines 104' can be metal lines in a metal layer, and the connecting conductive line 108' can be a metal line in another metal layer.

Using the above method, conductive line cut pattern such as CPO pattern can be implemented even when the cut pattern has a pitch that is less than the lithography process pitch limit. For example, a CPO pattern pitch of 0.080 µm can be used, which is less than a fabrication process limit of 0.13 µm.

According to some embodiments, a method includes placing two modeled conductive lines in a layout. Two parallel cut lines are placed over at least a part of the two modeled conductive lines in the layout. The cut lines designate cut sections of the two conductive lines and the cut lines are spaced from each other within a fabrication process limit. The two cut lines are connected in the layout. Two physical conductive lines are patterned over a substrate in a physical integrated circuit using the two connected parallel cut lines.

According to some embodiments, a conductive line structure includes a substrate and two physical conductive lines formed over the substrate. Each of the two physical conductive lines has a cut section. The cut section has a first cut angle and a second cut angle that is different from the first cut angle.

According to some embodiments, a computer readable medium contains an integrated circuit layout. The integrated circuit layout includes two modeled conductive lines and two parallel cut lines disposed over at least a part of the two modeled conductive lines. The two cut lines are spaced from each other within a fabrication process limit. The cut lines designate cut sections of the two modeled conductive lines. A connecting cut line connects the two parallel cut lines.

In other aspect, disclosed herein is a semiconductor device, including: a substrate; a first conductive line including a first cut section disposed over the substrate; and a second conductive line including a second cut section disposed over the substrate so that the first cut section and the second cut section are spaced from each other less than a minimum spacing requirement for a pre-determined photolithography processing node.

In an embodiment, a method includes: placing two modeled conductive lines in a layout; placing two cut lines over at least a part of the two modeled conductive lines in the layout, the cut lines being spaced from each other less than a minimum spacing requirement for a photolithography processing node; connecting the two cut lines in the layout with a connecting cut line; determining a merged cut section using the two cut lines and the connecting cut line; and patterning two physical conductive lines disposed over a substrate in a physical integrated circuit with a photolithography process at the photolithography processing node using the merged cut section as an etching mask.

In some embodiments, the method further includes forming the two physical conductive lines over the substrate. In some embodiments of the method, connecting the two cut lines includes: placing a connecting conductive line between the two modeled conductive lines in the layout at a location between the two cut lines in a different layer from the two modeled conductive lines. In some embodiments, the method further includes forming a physical connecting conductive line over the substrate in the physical integrated circuit between the two physical conductive lines at a different layer from the two physical conductive lines. In some embodiments, the method further includes forming at least one via over the physical connecting conductive line in the physical integrated circuit, the at least one via being electrically connected to the physical connecting conductive line. In some embodiments of the method, patterning the two physical conductive lines includes etching a region corresponding to the merged cut section, on the two physical conductive lines over the substrate. In some embodiments of the method, each of the two physical conductive lines has a first cut angle and a second cut angle that is different from the first cut angle. In some embodiments of the method, the first cut angle is a right angle line with respect to the two physical conductive lines. In some embodiments of the method, the second cut angle is in a range from 10 degrees to 45 degrees from a right angle line with respect to the two physical conductive lines.

In an embodiment, a method includes: modeling a first conductive line and a second conductive line in a layout; modeling a first cut line and a second cut line in the layout, the first cut line and the second cut line, respectively, intersecting the first conductive line and the second conductive line in a top-down view of the layout, the first cut line and the second cut line being spaced apart a first distance in the top-down view, the first distance being less than a minimum spacing for a photolithography processing node; modeling a connecting cut line in the layout, the connecting cut line connecting the first cut line and the second cut line in the top-down view; and fabricating an integrated circuit according to the layout with a photolithography process at the photolithography processing node, where the connecting cut line, the first cut line, and the second cut line are used as a merged cut section during the photolithography process, the merged cut section overlapping a first portion of the first conductive line and a second portion of the second conductive line.

In some embodiments of the method, modeling the first conductive line and the second conductive line includes modeling the first conductive line and the second conductive line in a first layer of the layout, and modeling the connecting cut line includes modeling the connecting cut line in a second layer of the layout, the second layer being different from the first layer. In some embodiments of the method, the second layer is over the first layer. In some embodiments of the method, the connecting cut line is a connecting conductive line overlapping the first conductive line and the second conductive line in the top-down view, the connecting cut line being disposed between the first cut line and the second cut line in the top-down view. In some embodiments of the method, fabricating the integrated circuit according to the layout includes: forming the first conductive line and the second conductive line over a substrate; and etching the merged cut section from the first conductive line and the second conductive line simultaneously with the photolithography process. In some embodiments of the method, forming the first conductive line and the second conductive line includes forming a first polysilicon line and a second polysilicon line over the substrate. In some embodiments of the method, forming the first conductive line and the second conductive line includes forming a first metal line and a second metal line over the substrate. In some embodiments of the method, the first distance is 0.08 μm.

In an embodiment, a method includes: modeling a first conductive line and a second conductive line in a first layer of a layout; modeling a first cut line and a second cut line in the first layer of the layout, the first cut line and the second cut line being spaced apart a first distance, the first distance being less than a minimum spacing for a photolithography processing node; modelling a connecting cut line in a second layer of the layout, the second layer being different from the first layer, the connecting cut line being laterally disposed between the first cut line and the second cut line; forming the first conductive line and the second conductive line over a substrate; and etching a merged cut section from the first conductive line and the second conductive line simultaneously with a photolithographic process at the photolithography processing node, the merged cut section being determined using the connecting cut line the first cut line and the second cut line.

In some embodiments of the method, the connecting cut line is parallel to the first cut line and the second cut line. In some embodiments of the method, the first cut line and the second cut line are perpendicular to the first conductive line and the second conductive line.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods, and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method comprising:
   placing two modeled conductive lines in a layout;
   determining a merged cut section mask by connecting two cut lines of a cut mask pattern in the layout with a connecting cut line mask pattern, the two cut lines being spaced from each other less than a minimum spacing requirement for a photolithography processing node;
   and
   patterning two physical conductive lines disposed over a substrate in a physical integrated circuit with a photolithography process at the same photolithography processing node using the merged cut section mask as an etching mask, wherein the two physical conductive lines corresponds to the two modeled conductive lines after removing portions corresponding to the merged cut section mask.

2. The method of claim 1 further comprising forming the two physical conductive lines over the substrate.

3. The method of claim 1 further comprising:
   placing a connecting conductive line between the two modeled conductive lines in the layout at a location between the two cut lines in a different layer from the two modeled conductive lines.

4. The method of claim 3 further comprising forming a physical connecting conductive line over the substrate in the physical integrated circuit between the two physical conductive lines at a different layer from the two physical conductive lines.

5. The method of claim 4 further comprising forming at least one via over the physical connecting conductive line in the physical integrated circuit, the at least one via being electrically connected to the physical connecting conductive line.

6. The method of claim 1, wherein patterning the two physical conductive lines comprises etching a region corresponding to the merged cut section mask, on the two physical conductive lines over the substrate.

7. The method of claim 1, wherein each of the two physical conductive lines has a first cut angle and a second cut angle that is different from the first cut angle.

8. The method of claim 7, wherein the first cut angle is a right angle line with respect to the two physical conductive lines.

9. The method of claim 7, wherein the second cut angle is in a range from 10 degrees to 45 degrees from a right angle line with respect to the two physical conductive lines.

10. A method comprising:
modeling a first conductive line and a second conductive line in a layout;
modeling a first cut line pattern and a second cut line pattern in the layout, the first cut line pattern and the second cut line pattern, respectively, intersecting the first conductive line and the second conductive line in a top-down view of the layout, the first cut line pattern and the second cut line pattern being spaced apart a first distance in the top-down view, the first distance being less than a minimum spacing for a photolithography processing node;
modeling a connecting cut line pattern in the layout, the connecting cut line pattern connecting the first cut line pattern and the second cut line pattern in the top-down view; and
fabricating an integrated circuit according to the layout with a photolithography process at the same photolithography processing node,
wherein the connecting cut line pattern, the first cut line pattern, and the second cut line pattern are used as a merged cut section pattern during the photolithography process to remove portions of the first conductive line and the second conductive line in the layout, the merged cut section pattern overlapping a first portion of the first conductive line and a second portion of the second conductive line.

11. The method of claim 10, wherein modeling the first conductive line and the second conductive line comprises modeling the first conductive line and the second conductive line in a first layer of the layout, and wherein modeling the connecting cut line pattern comprises modeling the connecting cut line pattern in a second layer of the layout, the second layer being different from the first layer.

12. The method of claim 11, wherein the second layer is over the first layer.

13. The method of claim 11, wherein the connecting cut line pattern is a connecting conductive line overlapping the first conductive line and the second conductive line in the top-down view, the connecting cut line pattern being disposed between the first cut line pattern and the second cut line pattern in the top-down view.

14. The method of claim 10, wherein fabricating the integrated circuit according to the layout comprises:
forming the first conductive line and the second conductive line over a substrate; and
etching the merged cut section pattern from the first conductive line and the second conductive line simultaneously with the photolithography process.

15. The method of claim 14, wherein forming the first conductive line and the second conductive line comprises forming a first polysilicon line and a second polysilicon line over the substrate.

16. The method of claim 14, wherein forming the first conductive line and the second conductive line comprises forming a first metal line and a second metal line over the substrate.

17. The method of claim 10, wherein the first distance is 0.08 μm.

18. A method comprising:
modeling a first conductive line and a second conductive line in a first layer of a layout;
modeling a first cut line pattern and a second cut line pattern in the first layer of the layout, the first cut line pattern and the second cut line pattern being spaced apart a first distance, the first distance being less than a minimum spacing for a photolithography processing node;
modelling a connecting cut line pattern in a second layer of the layout, the second layer being different from the first layer, the connecting cut line pattern being laterally disposed between the first cut line pattern and the second cut line pattern;
forming the first conductive line and the second conductive line over a substrate; and
etching the first conductive line and the second conductive line simultaneously with a photolithographic process at the same photolithography processing node using a merged cut section as a mask, the merged cut section being determined using the connecting cut line pattern, the first cut line pattern, and the second cut line pattern.

19. The method of claim 18, wherein the connecting cut line pattern is parallel to the first cut line pattern and the second cut line pattern.

20. The method of claim 18 wherein the first cut line pattern and the second cut line pattern are perpendicular to the first conductive line and the second conductive line.

* * * * *